United States Patent
Koops et al.

Patent Number: 5,917,747
Date of Patent: Jun. 29, 1999

[54] DIGITAL MEMORY ELEMENT

[75] Inventors: Hans Koops; Gerhard Hanke, both of Ober-Ramstadt, Germany

[73] Assignee: Deutsche Telekom AG, Bonn, Germany

[21] Appl. No.: 08/906,620

[22] Filed: Aug. 7, 1997

[30] Foreign Application Priority Data

Aug. 9, 1996 [DE] Germany ............................ 196 32 136

[51] Int. Cl.$^6$ .................................................. G11C 13/00
[52] U.S. Cl. .......................... 365/149; 365/112; 365/118; 365/106; 365/109; 365/128
[58] Field of Search ................... 365/120, 225.6, 365/149, 112, 118, 106, 109, 128

[56] References Cited

U.S. PATENT DOCUMENTS 5,036,317  7/1991  Buzak ....................................... 340/783
5,231,606  7/1993  Gray ....................................... 365/225.6

FOREIGN PATENT DOCUMENTS 44 16 597  11/1995  Germany .

OTHER PUBLICATIONS

Brodie, et al., The Physics of Micro/Nana–Fabrication (1992).

*Primary Examiner*—Viet Q. Nguyen
*Attorney, Agent, or Firm*—Kenyon & Kenyon

[57] ABSTRACT

A digital memory element having three miniaturized electron tubes, which is faster and smaller by at least one further order of magnitude than known digital memory elements, can be produced through conventional and additive lithography. The digital memory element is a small memory capacitor linked to the anode of a write-in tube, to the cathode of an erase tube, and to a deflection element of a read-out tube which deflects an electron beam, in dependence upon the charge state, to one of two detectors.

5 Claims, 1 Drawing Sheet

DIGITAL MEMORY ELEMENT

FIELD OF THE INVENTION

The present invention relates to a digital memory element, and more particularly to a digital memory element capable of being written into and read from at very high frequencies.

RELATED TECHNOLOGY

The main requirement of digital memory elements, besides having a small size, is high-speed read-in and read-out capabilities. Present semiconductor memories do, in fact, achieve a high packing density, but only in fractions of the available GHz range. Known digital memory elements having a memory capacitor and a plurality of tubes, of which at least one is controlled by electron beam deflection, are only faster by one order of magnitude and are too large for practical use.

On present knowledge, there are no known digital memory elements based on miniaturized field-emission tubes that work at frequencies in the upper GHz range. Conventional vacuum-microelectronic tubes have the drawback of having too large a grid-anode and grid-cathode capacitance, which limits their mode of operation to a few GHz of range. Reliable micro-tubes of metal or silicon cathodes have not been introduced in known methods heretofore. Until now, any further use of these types of elements for complex circuit arrangements has not been possible because of the unique quality of each emitter due to the manufacturing process, and because of the difficulty entailed in installing a resistor or controller to stabilize the current for each emitter [I. Brodie, J. J. Muray "The Physics of Micro and Nano-Fabrication" Plenum Press, N.Y. 1992]. In known methods heretofore, half-way reliable results were only able to be achieved by using complete cathode arrays, which are also the basis for manufacturing flat video screens with field emitters [German Published Unexamined Application DE-OS 44 16 597.8].

SUMMARY OF THE INVENTION

An object of the present invention is to create a digital memory element which is able to be written and read in frequencies in the upper GHz range, and whose geometric dimensions are so small that a high packing density is attainable.

The present invention therefore provides a digital memory element having input terminals for writing in and for erasing and outputs for reading out its status. The digital memory element is comprised of a memory capacitor and a plurality of miniaturized electron tubes, of which at least one is controlled by electron beam deflection, characterized in that a very small storage capacitor is linked to elements of three miniaturized electron tubes, which may be produced by means of conventional and additive lithography. The capacitor is linked, in fact, to the anode of a write-in tube, to the cathode of an erase tube ($K_{lr}$) and to a deflection element of a read-out tube ($AB_{ar}$), so that it is able to be charged with the write-in tube and discharged with the erase tube. The capacitor deflects the electron beam of the read-out tube, in dependence upon the charge state (remaining unchanged in this case) to one of two detectors (uncharged to $D_{1ar}$ or in response to a negative charging voltage to $D_{2ar}$) connected to the status outputs.

Advantageously, the write-in and erase tubes may be diodes, and assigned to the cathode of the write-in tube ($K_{er}$) may be a current-limiting resistor, which defines the charge quantity at the storage capacitor given a voltage pulse up to the required deflection voltage at the deflection element ($AB_{ar}$) of the read-out tube.

Moreover, the read-out tube may comprise a cathode, a divided extractor, and of two mutually insulated anodes, which are connected to output terminals or other memory elements of a memory matrix.

Furthermore, the erasing of the memory contents of the storage capacitance C may take place through the application of an erasing extractor voltage $+U_{extr}$ at the anode of the erase tube ($A_{lr}$) by means of field emission.

DETAILED DESCRIPTION

Figure 1:
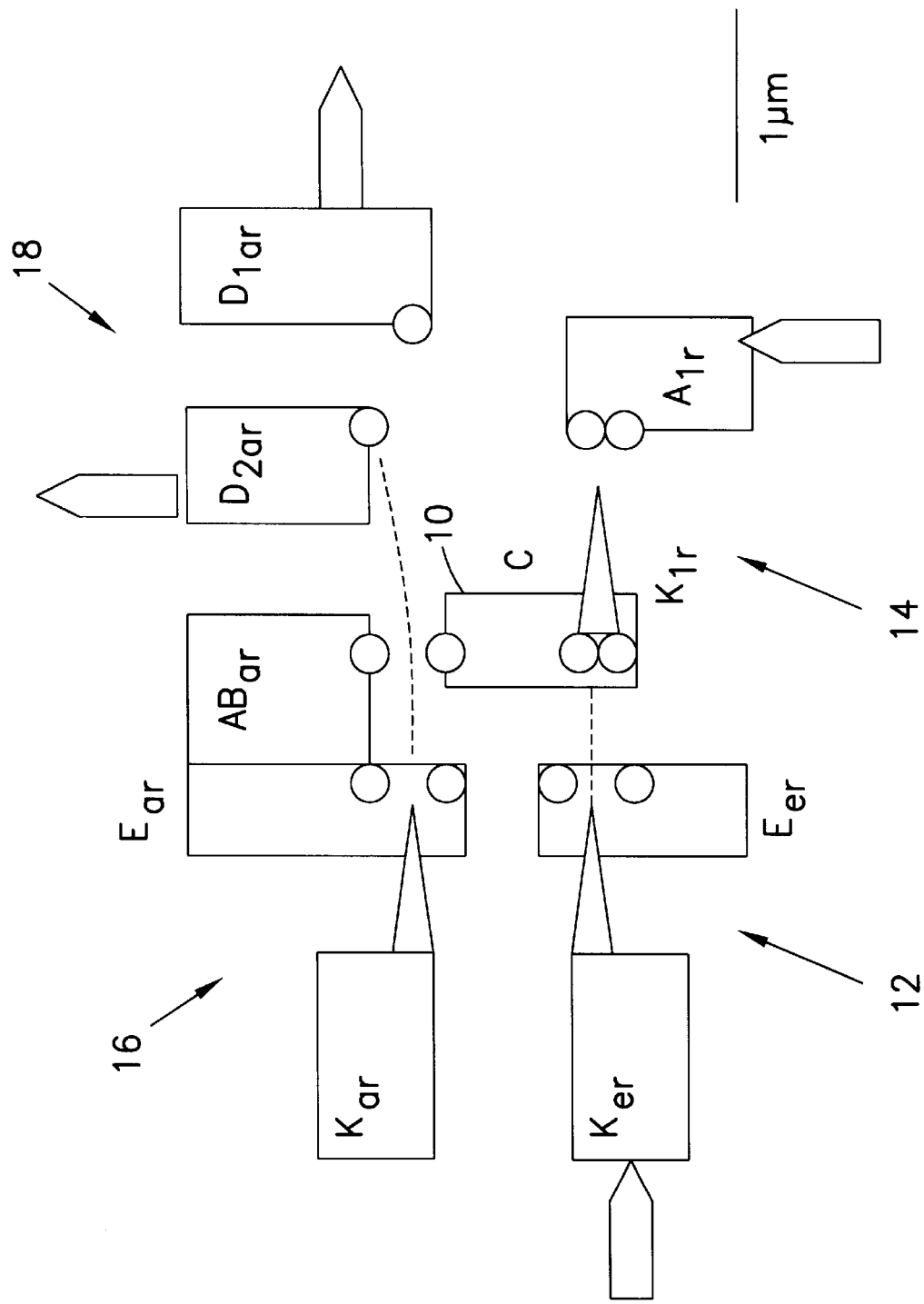
FIG. 1 is a schematic representation of a high-speed digital memory element comprised of three miniaturized tubes having THz switching properties. The write-in tube is used to charge the storage capacitor. The erase tube is used to discharge the storage capacitor. The read-out tube is used to read out the status of the storage capacitor. C is the storage capacitance.

Referring to FIG. 1, the digital memory element includes a small capacitor 10, which is charged by the electron beam of a first vacuum-microelectronic field-emission tube 12, referred to as the write-in tube. The write-in tube 12 is responsible for the writing in information. The capacitor 10 is so small that a pulse of about $10^4$ electrons suffices to load the capacitor to a voltage of about 5 volts. The charge on the capacitor 10 can be discharged by a discharge device in the form of a second vacuum-microelectronic field-emission tube 14, referred to as an erase tube, which is switched on with a positive suction voltage. The field emission cathode of the erase tube 14 is located on the memory capacitor 10, as shown. The charge condition of the capacitor 10 is indicated by a read-out tube 16. This read-out tube 16 emits an electron beam and comprises a deflection element AB as a second element. Given an uncharged deflection-plate capacitor, the beam of the tube passes straight through deflection element AB and arrives at detector D1 of detector pair 18. If the capacitor is charged, then, through the charging of the deflection element side which is located on the capacitor and through the thus created electric field, the beam is caused to deflect, so that it hits detector D2.

The digital memory element is constructed through the application of electron-beam-induced deposition. This type of additive lithography using electron deposition makes it possible to construct miniaturized tubes of a 0.5 μm length and 1 μm width on a metallic printed-conductor structure with the aid of a computer-controlled electron beam. The manufacturing method enables very fine conductive points to be built up at the required circuit locations for electron emission through a tunnel effect. The necessary detectors and extractor structures can be fashioned from deposited, vertically disposed wires or from wires routed in space during assembly.

The structures of the components are 0.1–0.2 μm thick and about 2 μm high. Therefore, the memory element as a whole is very small and does not require high electrical currents or voltage power. The wires of a 0.1 μm diameter and up to 10 μm length can carry current densities on the order of up to 2 MA/cm². This value is eight times greater than that of aluminum (250000 A/cm²), for example. Field emission out of the wire points is possible with an internal resistance about 15 times smaller than that of conventional field emitters used in vacuum microelectronics. Field-emitter electron sources are able to be built up using this technique with a current-stabilizing resistance incorporated therein. As a result, each point works in a controlled manner and the requirement for redundancy at the points in the tube or in the parallel arranged emitters is reduced.

The wires themselves end in very fine points with a radii >5 nm, but with nanometer-size crystals which project out of the points and, therefore, effect a strengthening of the field emission. This field emission strengthening is manifested by a marked reduction in extraction voltage for the field-electron current. The resistance of the deposited materials is adjustable within a range of five orders of magnitude by way of varying the deposition conditions. Therefore, an internal tube resistance of less than a megaohm can be achieved with the field emission. The memory functions can be carried out with a signal-to-noise ratio of 100 when 10,000 electrons are used to charge the capacitance. For current stabilization of the field emission, the construction method permits insertion of one stabilizing resistor per emitter point, so that the same number of electrons is always used.

The digital memory element does not require any semi-conductor material as a base. Glass or quartz can be used. The printed circuit traces are fabricated in a lift-off process by means of lithography and vapor deposition. The technique is compatible with all other electronic assembly techniques.

Computer-controlled electron-beam-induced deposition makes it possible to produce three-dimensional structures, which function as electrodes for the microtubes and tube systems that produce individual electron beams, or to fabricate a multiplicity of the structures side-by-side.

Thus, a technique has been discovered as a production means for the deposition three-dimensional structures which will enable a plurality of electron beams to be produced on lithographic circuits and substrate boards. From microtubes of this kind, the described, high-speed erasable digital memory having 100 GHz switching times is to be produced in a parallel fabrication technique.

Because of the fine definition attainable in material production with computer control, new types of tubes, components, differential amplifiers, and other circuits can be directly written without the use of semiconductor materials. The smallness and nanometer precision of these circuits means that they can be operated at higher frequencies than had previously been attainable with conventional tubes. The fabrication technique for electronic circuits is greatly simplified, while the packing density substantially increased.

Digital memory elements are able to be manufactured from microtubes using additive lithography (in accordance with the previously mentioned German Published Unexamined Application DE-OS 44 16 597.8), without the use of semiconductor materials having nanometer precision produced by computer control, and with field strengths in the element which are controlled for a long lifetime and only rise above $10^6$ V/cm in the emitter range. This prevents and suppresses the growth of carbon bridges out of polymers as short-circuit conductors. The increase in "transconductance" and the lowering of the internal resistance succeed, if required, by using a plurality of deposited cathodes having a nano-crystalline structure, as well as by increasing the packing density of the tubes using 0.5 $\mu$m technology for printed circuit traces and spaces. FIG. 1 illustrates the basic exemplary structure of the digital memory element, comprising one write, erase, and read-out tube each.

The method of a functioning of the digital memory element can be explained as follows:

1) Charging the capacitor to a storage capacitance C, using the write-in tube, through an applied voltage at $K_{er}$, i.e. up to the required deflection voltage at the deflection element $AB_{ar}$ of the read-out tube. A voltage pulse with a current limiting resistance can define the charge quantity.

2) Reading out the charge state of the capacitor using the read-out tube. In response to an uncharged capacitor, the electron beam of the read-out tube falls on detector $D_{1ar}$. In response to an applied, negative charging voltage at the capacitor, the read-out beam is deflected and falls on detector $D_{2ar}$. Thus, the charge condition of the capacitor can be read out without changing the memory contents.

3) Erasing the memory contents of the capacitor is carried out by applying an erasing extractor voltage $+U_{extr}$ to the anode of erase tube $A_{lr}$. Field emission at the erase tube follows in response to an applied voltage. The discharge current can be adjusted to 150 $\mu$A, so that the discharging can take place in 0.1 ps in order to attain steeper pulse profiles.

With the present invention, switching voltages of −20 V to +20 V can be used for experiments. (Preferably, in an actual application case the range is ±10 V).

As one specific embodiment, the layout critical dimension equals 0.5 $\mu$m (smallest feature-size width and feature-size spacing). An Au-lift-off manufacturing process is used. The deposition structures are made of $Me_2Au$ (using tfac), at 300 pA write current, 25 keV electrons.

Each cathode point is manufactured in about 2 minutes, so that for three cathode points 6 minutes is required. Twelve extractors or anode wires 1 $\mu$m are manufactured every 1 minute, for a total of 12 minutes. The placement of the depositions in 4 $\mu$m×2 $\mu$m size visual field is computer controlled.

An estimation of the limiting frequency of the write, erase, and read processes yields the following values, based on the assumption that the field-emitter tube works at 150 $\mu$A, $U_{extr}$<10 V and transconductance $R_i$>15 $\mu$S.

The switching possibilities of the field-emission tube are:

1) Point at $-U_{ext}$; extractor at 0 V, (write-in tube)
2) Extractor at $+U_{extr}$, point at 0 V; (erase tube)
3) Deflection of the beam using deflection plates Up<10 V (read-out tube)

The storage capacitance can be calculated as:

$$C = e_0 e_r \cdot F/d = 8.86 \cdot 10^{-12} \cdot 1 \cdot (0.2 \cdot 10^{-6})^2 / 10^{-6} \ As/V = 3.5 \cdot 10^{-18} \ F$$

where the rod diameter 0.2 $\mu$m, length is 1 $\mu$m, spacing is 1 $\mu$m, and the dielectric material is air $e_r=1$ To charge this capacitor to 5 volt deflection voltage, a charge of $Q=C \cdot U \approx 1.6 \cdot 10^{-17}$ As=100e=100 electrons is required.

This charge can be applied in 1 psec with a current of 16 $\mu$A (corresponds to a frequency of 1 THz).

The statistical error is then 10% or S/N=10 (signal-to-noise ratio).

Switching with 0.1 ps can then take place at 160 $\mu$A discharge current (voltage pulse at the extractor tube).

What is claimed is:

1. A digital memory element comprising:
   a memory capacitor having a small storage capacitance;
   a first miniaturized electron tube having a first anode cooperating with the memory capacitor, the first miniaturized electron tube capable of charging the memory capacitor;

a second miniaturized electron tube having a cathode cooperating with the memory capacitor, the second miniaturized electron tube capable of discharging the memory capacitor;

a third miniaturized electron tube having a deflection element for deflection of an electron beam in dependence upon the charge of the memory capacitor, the electron beam emitted from the third miniaturized electron tube; and a pair of detectors, wherein the electron beam strikes a first one of the pair of detectors when the memory capacitor is uncharged and strikes a second one of the pair of detectors when the memory capacitor is charged.

2. The digital memory element as recited in claim 1 further comprising:

at least one input terminal for controlling the writing in and the erasing of information; and at least one output terminal for the reading out of a charge status of the very small storage capacitance of the memory capacitor.

3. The digital memory element as recited in claim 1 wherein the first miniaturized electron tube and the second miniaturized electron tube are both diodes, and assigned to the cathode of the second miniaturized electron tube is a current-limiting resistor.

4. The digital memory element as recited in claim 1 wherein the third miniaturized electron tube further comprises another cathode and a pair of mutually insulated anodes.

5. The digital memory element as recited in claim 1 wherein erasing of a memory content of the memory capacitor takes place through application of an erasing voltage at an anode of the second miniaturized electron tube through field emission.

* * * * *